(12) United States Patent
Noda et al.

(10) Patent No.: US 6,496,403 B2
(45) Date of Patent: Dec. 17, 2002

(54) SEMICONDUCTOR MEMORY DEVICE

(75) Inventors: Hiromasa Noda, Hamura (JP);
Sadayuki Okuma, Hidaka (JP);
Hiroshi Ichikawa, Hachioji (JP);
Hiroki Miyashita, Hachioji (JP);
Yasushi Takahashi, Saitama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/906,809

(22) Filed: Jul. 18, 2001

(65) Prior Publication Data

US 2002/0012285 A1 Jan. 31, 2002

(30) Foreign Application Priority Data

Jul. 31, 2000 (JP) ........................................ 2000-230946

(51) Int. Cl.⁷ .............................. G11C 5/06; G11C 7/00
(52) U.S. Cl. .................... 365/63; 365/189.05; 365/233; 365/238.5
(58) Field of Search .............................. 365/189.01, 51, 365/63, 238.5, 189.05, 233; 257/355; 327/283, 290

(56) References Cited

U.S. PATENT DOCUMENTS

| | | | | |
|---|---|---|---|---|
| 4,425,516 A | * | 1/1984 | Wanlass | 365/189.05 |
| 6,011,751 A | * | 1/2000 | Hirabayashi | 365/236 |
| 6,060,916 A | | 5/2000 | Park | 327/99 |
| 6,072,218 A | * | 6/2000 | Chang et al. | 257/355 |
| 6,094,375 A | | 7/2000 | Lee | 365/189 |
| 6,151,271 A | | 11/2000 | Lee | 365/233 |
| 6,151,272 A | | 11/2000 | La et al. | 365/233 |
| 6,335,901 B1 | * | 1/2002 | Morita et al. | 365/233 |
| 6,344,763 B1 | * | 2/2002 | Aritomi et al. | 327/283 |

FOREIGN PATENT DOCUMENTS

| | | |
|---|---|---|
| JP | 10-302465 | 11/1998 |
| JP | 11-191292 | 7/1999 |
| JP | 11-203868 | 7/1999 |
| JP | 11-213668 | 8/1999 |
| JP | 2000-40398 | 2/2000 |
| JP | 2000-67577 | 3/2000 |

* cited by examiner

Primary Examiner—Son T. Dinh
(74) Attorney, Agent, or Firm—Miles & Stockbridge P.C.

(57) ABSTRACT

Disclosed a semiconductor memory device in which an access to a memory cell is designated according to a command, and a common data terminal is used as an input terminal to which a write signal to the memory cell is input and an output terminal from which a read signal from the memory cell is output. The semiconductor memory device includes: a first input circuit having input capacitance corresponding to the input terminal to which the command is input; and a second input circuit having input capacitance corresponding to the data terminal. A mask signal for checking the write signal input from the data terminal is input by either the first or second input circuit by a bonding option technique.

42 Claims, 11 Drawing Sheets

SD-MODE

SEMICONDUCTOR MEMORY DEVICE

BACKGROUND

The present invention relates to a semiconductor memory device and, more particularly, a technique effective for use in a semiconductor memory device used in a plurality of modes by using a common chip as a base.

Bonding option is effective means by which products adapted to the market trend can be supplied without a delay by storing products subjected to a preceding process and realizing products according to a selected product specification by bonding in a following process. In a dynamic RAM (Random Access Memory) (hereinbelow, simply called a DRAM), the bonding option is used for selection of a word configuration (bit configuration) such as ×4, ×8, or ×16 configuration. A metal option technique of changing a circuit function by selective layout of metal wires is also known.

Japanese Unexamined Patent Application No. Hei 10(1998)-302465 (corresponding to U.S. Pat. No. 6,060, 916) discloses a technique of enabling a single data rate (SDR) mode or a double data rate (DDR) mode to be selected on a memory chip in accordance with an output signal of a mode selection unit 301 constructed by either a photo mask or fuse.

Japanese Unexamined Patent Application No. Hei 11(1999)-203868 (corresponding to U.S. Pat. No. 6,094, 375) discloses a technique of selecting the SDR mode or the DDR mode in accordance with an output signal of a mode selection signal generating unit constructed by a fuse, accessing a memory cell by a group of column addresses in the SDR mode, and accessing a memory cell by the remaining column addresses except for a specific column address in the DDR mode.

Japanese Unexamined Patent Application No. Hei 11(1999)-213668 (corresponding to U.S. Pat. No. 6,151, 271) discloses a technique of programming a DDR or SDR operation mode of a synchronous DRAM by a manufacturer or user, holding a mode selection signal in a mode register, outputting the mode selection signal from the mode register to a control signal generating unit, and outputting, as an internal clock, either a first clock having a cycle of an integral multiple of that of an external system clock and a second clock having a cycle which is double of the first clock. The DDR or SDR operation mode is fixed by, for example, metal option, mask option, bonding option, or a fuse by a manufacturer in a manufacturing process.

Japanese Unexamined Patent Application No. 2000-67577 discloses a synchronous semiconductor memory device in which, in a SDR SDRAM operation mode, an input/output buffer circuit operates synchronously with an external clock signal and, in a DDR SDRAM operation mode, an internal clock signal of a frequency twice as high as that of the external clock signal is generated, and the input/output buffer circuit operates synchronously with the internal clock signal.

Japanese Unexamined Patent Application No. 2000-40398 (corresponding to U.S. Pat. No. 6,151,272) discloses a technique of testing a DDR synchronous DRAM integrated circuit device by a low-speed tester by activating a SDR mode signal to operate the DDR synchronous DRAM integrated circuit device in a SDR mode.

Japanese Unexamined Patent Application No. Hei 11(1999)-191292 (corresponding to U.S. Pat. No. 6,011, 751) discloses a synchronous semiconductor memory device capable of selectively generating a burst address signal in a linear mode or an interleave mode so as to be selectively adapted to the SDR operation mode or the DDR operation mode by selecting either a configuration in which multiplexers are provided at ante stages of a plurality of registers, and a connection relation of the registers is selected, thereby incrementing an address or a configuration of selecting a signal obtained by inverting a register output by a multiplexer.

SUMMARY OF THE INVENTION

In order to be adapted to a high speed memory system of the next generation, a DDR-SDRAM (Double Data Rate Synchronous DRAM) is proposed. Since the DDR-SDRAM is obtained by improving an SDRAM (Synchronous DRAM) in order to achieve higher performances, the DDR-SDRAM and the SDRAM have many common portions from a circuit viewpoint. The inventors of the present invention paid attention on the commonality between the SDRAM and the DDR-SDRAM and examined the possibility of improving developed TAT, reduction in manufacturing cost as a total, and so on by realizing formation of the SDRAM and the DDR-SDRAM on the same chip.

During the examination, a large difference was found between an input interface in a final product specification of the DDR-SDRAM and that of the SDRAM. Specifically, in the SDRAM, a mask signal is input in response to a command input. On the other hand, in the DDR-SDRAM, a mask signal is input in response to a write signal. Regarding such inputs of the mask signals, not only just signal input timings but also input capacitances of signal pins seen from the host side have to be made different from each other. For example, the standard of the input capacitance of a data mask signal pin in the SDRAM is set in a range from 2.5 to 3.8 pF which is the same as that of a command pin such as /CS or /RAS and that of an address pin. In contrast, in the DDR-SDRAM, it is set in a range from 4.0 to 5.5 pF which is the same as that of a data pin. Consequently, there is no common area of an input capacitance value between the SDRAM and DDR-SDRAM. In addition to the difference in the input capacitances, the input timings are also different from each other as described above. Consequently, internal timing adjustment is necessary. It was made clear by the inventors that, when two kinds of circuits for the DDR-SDRAM and the SDRAM are mounted on the same chip, a problem such that the circuit scale is enlarged occurs.

An object of the invention is to provide a semiconductor memory device having an input circuit adapted for two kinds of input specifications while suppressing enlargement of the circuit scale. Another object of the invention is to provide an SDRAM and a DDR-SDRAM formed by using a common chip. The above and other objects and novel features of the invention will become apparent from the description of the specification and the appended claims.

A representative one of inventions disclosed in the application will be briefly described as follows. In a semiconductor memory device in which an access to a memory cell is designated according to a command, and a common data terminal is used as an input terminal to which a write signal to the memory cell is input and an output terminal from which a read signal from the memory cell is output, a first input circuit having input capacitance corresponding to the input terminal to which the command is input and a second input circuit having input capacitance corresponding to the data terminal are formed. A mask signal for checking the write signal input from the data terminal is input by either the first or second input circuit by a bonding option technique.

Another representative one of inventions disclosed in the application will be briefly described as follows. In a semiconductor memory device in which an access to any of the memory cells is designated according to a command, and a common data terminal is used as an input terminal to which a write signal to the memory cell is input and an output terminal from which a read signal from the memory cell is output, an input circuit having addition capacitance corresponding to a difference between first input capacitance corresponding to the input terminal to which the command is input and second input capacitance corresponding to the data terminal is formed. By a metal option technique, the addition capacitance is not connected in a configuration of inputting the mask signal in response to the command, or the addition capacitance is connected to the input circuit in a configuration of inputting the mask signal in response to the write signal.

DETAILED DESCRIPTION

Figure 1:
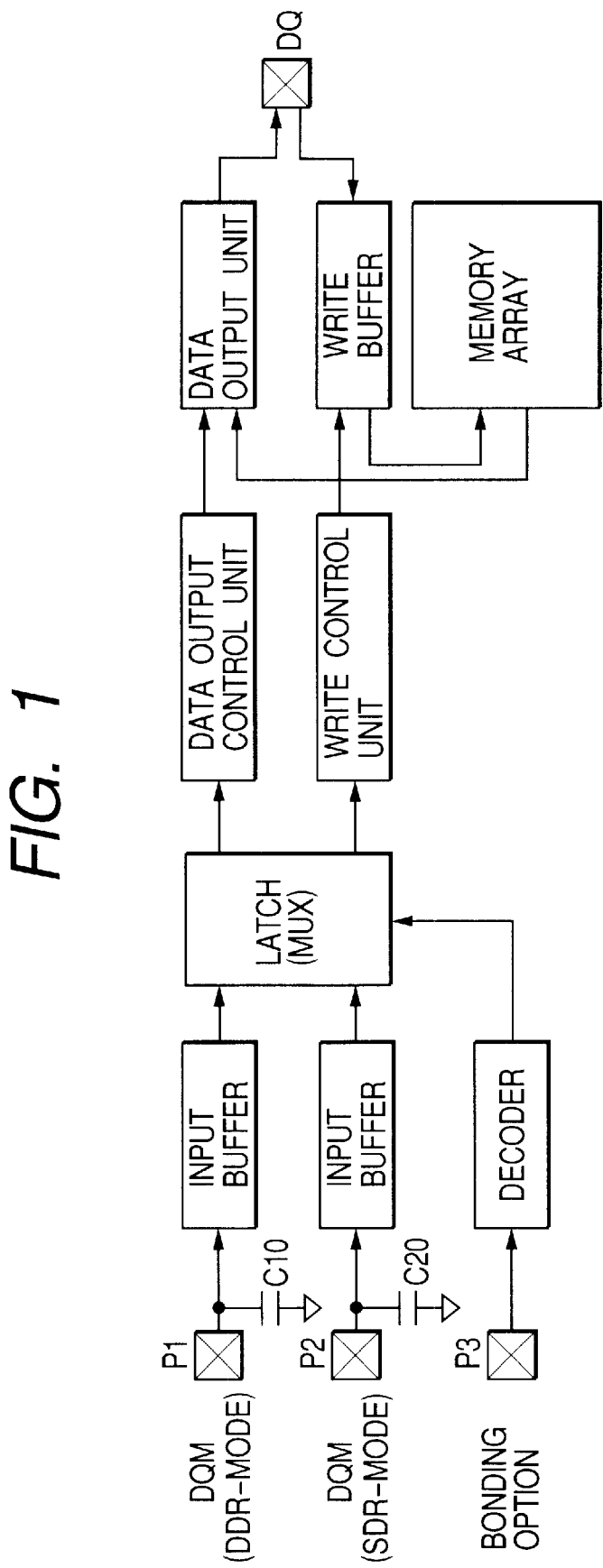
FIG. 1 is a schematic block diagram showing the main portion of an example of a semiconductor memory device according to the invention.

FIG. 1 is a schematic block diagram showing the main portion of an example of a semiconductor memory device according to the invention. In the example, to realize switching of input capacitance by bonding option, two input buffers having input pads P1 and P2 having an input capacitance C10 adapted to a DDR-SDRAM and an input capacitance C20 adapted to an SDRAM, respectively, are provided. In the case of using the device as a DDR-SDRAM, a DQM (DDR) signal line is bonded to the input pad P1, and a DQM (SDR) signal line for the input pad P2 is bonded to, for example, VSS.

An input pad P3 is provided for bonding option. For example, by bonding the input pad P3 to VSS, a decoder at the next stage generates a selection signal supplied to a latch to control the latch to select and latch an output signal of the input buffer for capturing the mask signal input to the input pad P1 via the DQM (DDR) signal line. In the case of constructing such the DDR-SDRAM, only write masking is performed by a mask signal (DQM). Consequently, the mask signal latched by the latch in accordance with the selection signal from the decoder is sent only to a write control unit.

In the case of using the device as the SDRAM, the DQM (SDR) signal line is bonded to the input pad P2, and the input pad P1 is bonded to, for example, VSS via the DQM (DDR) signal line. The input pad P3 is used for bonding option. For example, by bonding the input pad P3 to VDD, the decoder at the next stage generates a selection signal supplied to the latch to control the latch to select and latch an output signal of the input buffer for capturing the mask signal input to the input pad P2 via the DQM (SDR) signal line. In the case of constructing the SDRAM, both read masking and write masking is performed by the mask signal (DQM). Consequently, the mask signal latched by the latch in accordance with the selection signal from the decoder is sent not only to the write control unit but also a data output control unit.

In the case of constructing the DDR-SDRAM by the bonding option technique as described above, the write control unit is controlled by the mask signal DQM(DDR), and an operation signal for a write buffer is generated by the write control unit. For example, when the write mask signal DQM(DDR) makes the writing operation valid, the write signal input from the data terminal DQ is sent to a memory array via the write buffer and written in a memory cell selected at this time. On the contrary, when the mask signal DQM(DDR) makes the writing operation invalid, an output of the write buffer becomes a high impedance, the write signal input from the data terminal DQ is not transmitted to the memory array, and only an operation of reading the selected memory cell is performed in the memory cell, so that data is held.

In the case of constructing the SDRAM by the bonding option technique as described above, both the write control unit and the data output control unit are controlled by the mask signal DQM(SDR). The masking operation by the write control unit is similar to the above. The mask signal DQM(SDR) is used also in the reading operation. In the data output control unit, an operation signal of the data output unit is generated according to the mask signal DQM(SDR). For example, when the mask signal DQM(SDR) makes the reading operation valid, a read signal from the memory array is outputted from the data terminal DQ via the data output unit. On the contrary, when the mask signal DQM(SDR) makes the reading operation invalid, an output of the data output unit becomes a high impedance, and the read signal from the memory cell selected in the memory array is not outputted.

The DDR-SDRAM and the SDRAM have different input capacitances as described above and also different timing signals. In the embodiment, as will be described hereinlater, timing adjustment is also performed in the latch. Moreover, a signal level in an input/output interface of the DDR-SDRAM and that of the SDRAM are different from each other. For example, a small amplitude signal like SSTL is prepared in the DDR-SDRAM. In the SDRAM, two kinds of signals SSTL and LVTTL are prepared. It can be therefore considered that the input level is limited to the SSTL in the SDRAM and DDR-SDRAM. However, by using an input circuit which will be described hereinlater, the signal LVTTL can be also employed.

Figure 2:
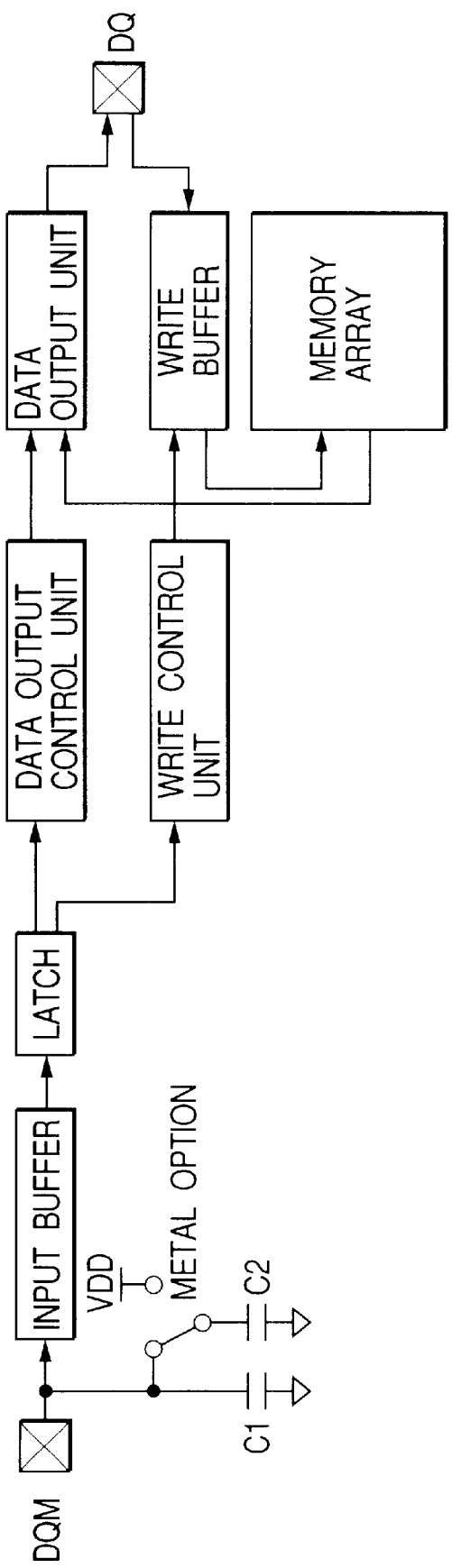
FIG. 2 is a schematic block diagram showing the main portion of another example of a semiconductor memory device according to the invention.

FIG. 2 is a schematic block diagram showing the main portion of another example of the semiconductor memory device according to the invention. In the example, switching between the input capacitor of the DDR-SDRAM and that of the SDRAM is realized by the metal option technique. One DQM pad is used and the capacitors C1 and C2 to be connected to the pad are switched by a metal switch. For example, in the case of using the device as the DDR-SDRAM, both the capacitors C1 and C2 are connected. In the case of using the device as the SDRAM, only the capacity C1 obtained by reducing a predetermined amount from the whole capacitance is connected. That is, the input capacitor C1 has an input capacitance adapted to an input circuit for a command in the case of constructing the SDRAM. The capacitor C2 has the capacitance obtained by subtracting the capacitance of the input capacitor C1 from the input capacitance corresponding to the data terminal DQ. Specifically, the capacitor C2 has an input capacitance, seen from the data terminal DQ, corresponding to the data output circuit in a data input/output circuit.

In the example, in the case of constructing the SDRAM, the capacitor C2 is not connected to the DQM pad. By connecting the capacitor C2 between the source voltage VDD and the ground potential VSS, the capacitor C2 is used as a stabilizing capacitor between the sources VDD and VSS. Although not limited, as the metal switch, a metal wiring layer as the second layer is used. Although not limited, in the case of a DRAM, a metal wiring layer as the first layer is used as a bit line to which memory cells are connected, the metal wiring layer as the second layer is used as a Y selection line for selecting the bit line, and a metal wiring layer as the third layer is used as a main word line. That is, the metal wiring layers as the second and third layers are two wiring layers formed as upper layers of the memory chip and disposed so as to perpendicularly cross each other. Consequently, they are used also as a power source line and a ground line.

In the configuration of using the metal wiring layer in the second layer as a metal switch as described above, the metal wiring layers as the second and third layers are not formed on a base chip. Consequently, as compared with the configuration using the bonding option technique as in the example of FIG. 1, masks used in a process of the metal wiring layer as the second layer and subsequent processes are more various, so that it is disadvantageous that developed TAT deteriorates. On the other hand, it is unnecessary to provide two sets of the DQM pads and input buffers corresponding to the DQM pads, so that it is advantageous with respect to reduction in the chip area. Although not shown in the drawing, in the latch, control signals adapted to the operations of the configuration of the DDR-SDRAM and SDRAM are also generated by metal option.

Figure 3:
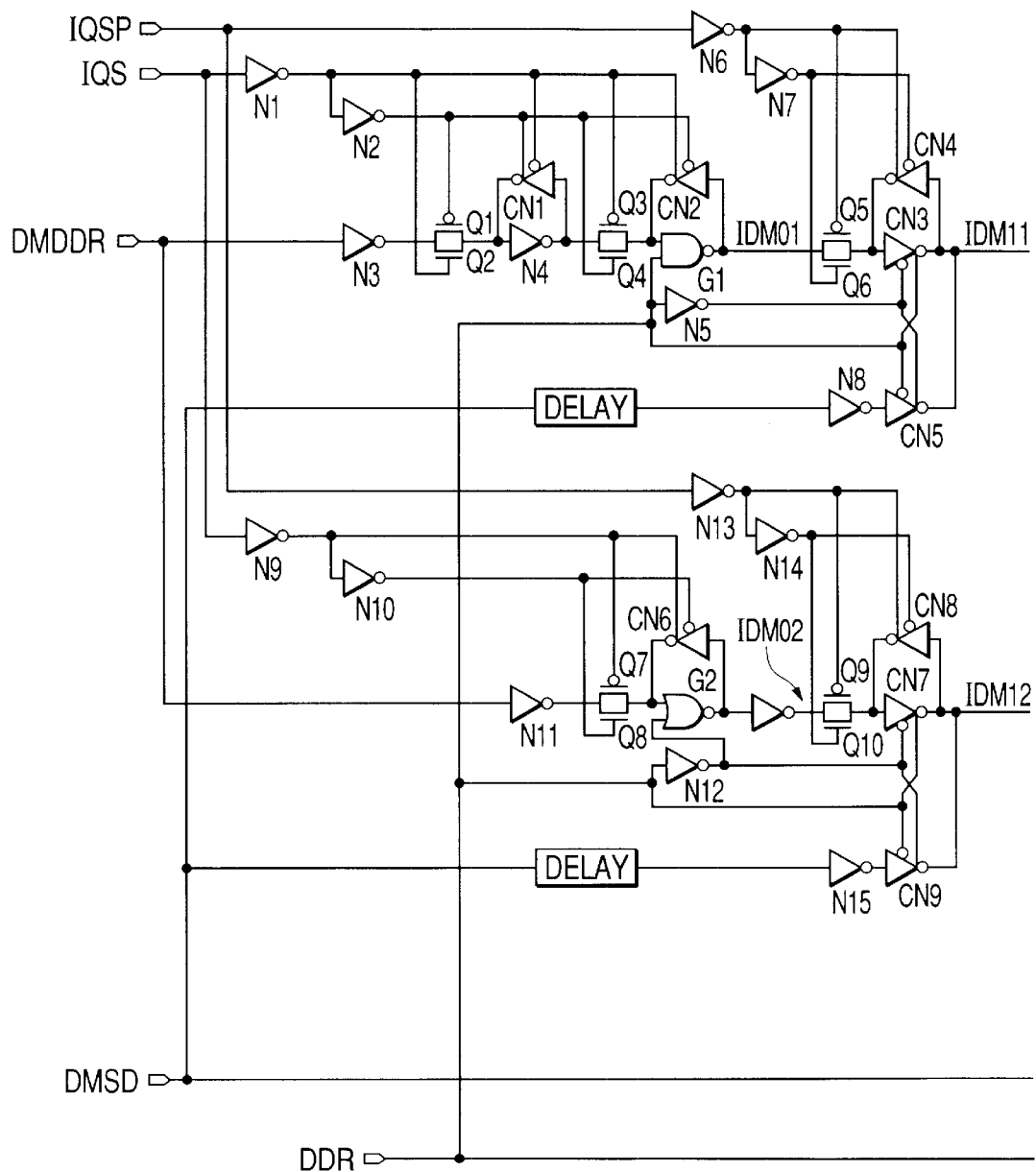
FIG. 3 is a circuit diagram showing an example of an input stage side of a latch in FIG. 1.
Figure 4:
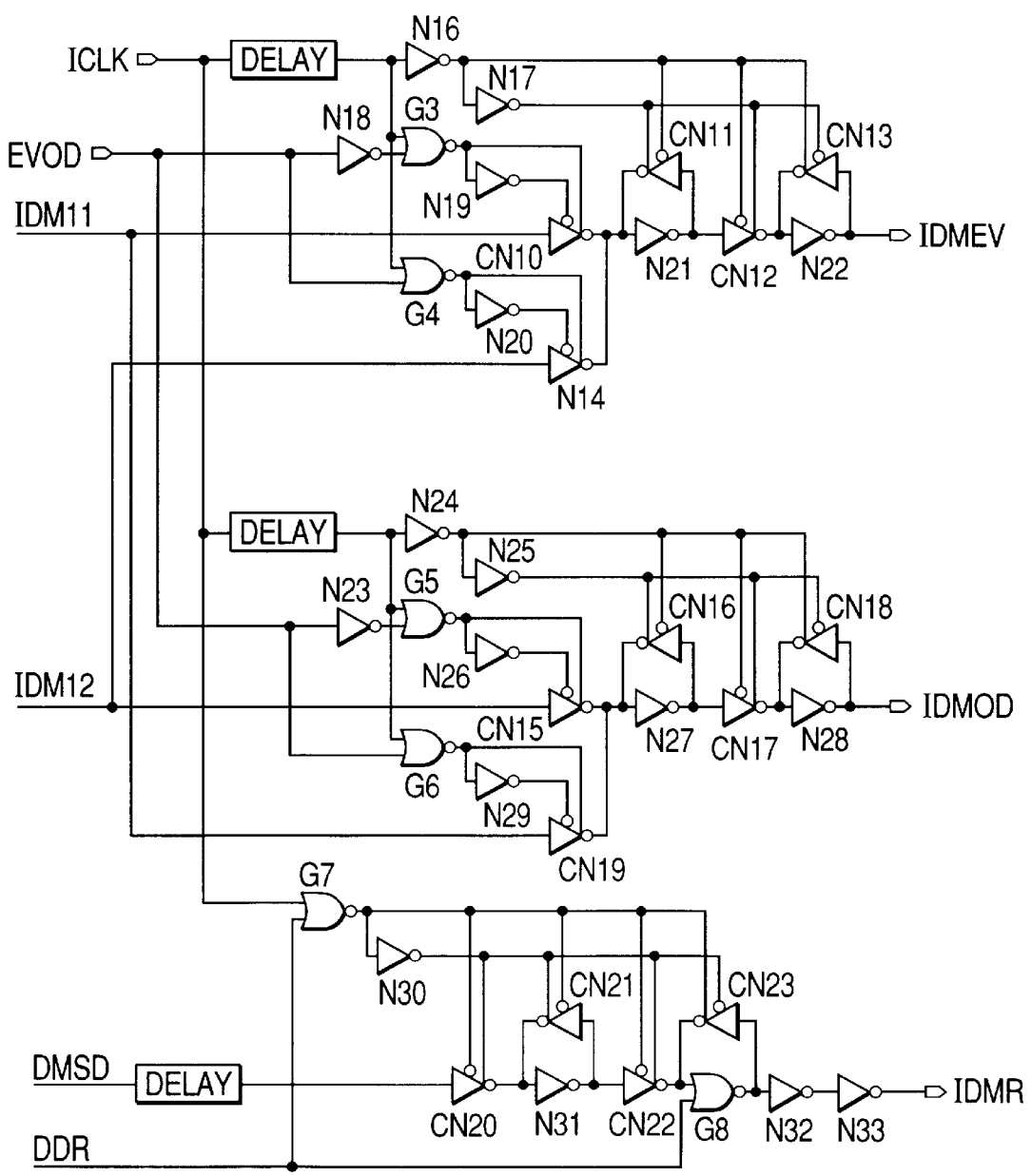
FIG. 4 is a circuit diagram showing an example of an output stage side of the latch in FIG. 1.
Figure 5:
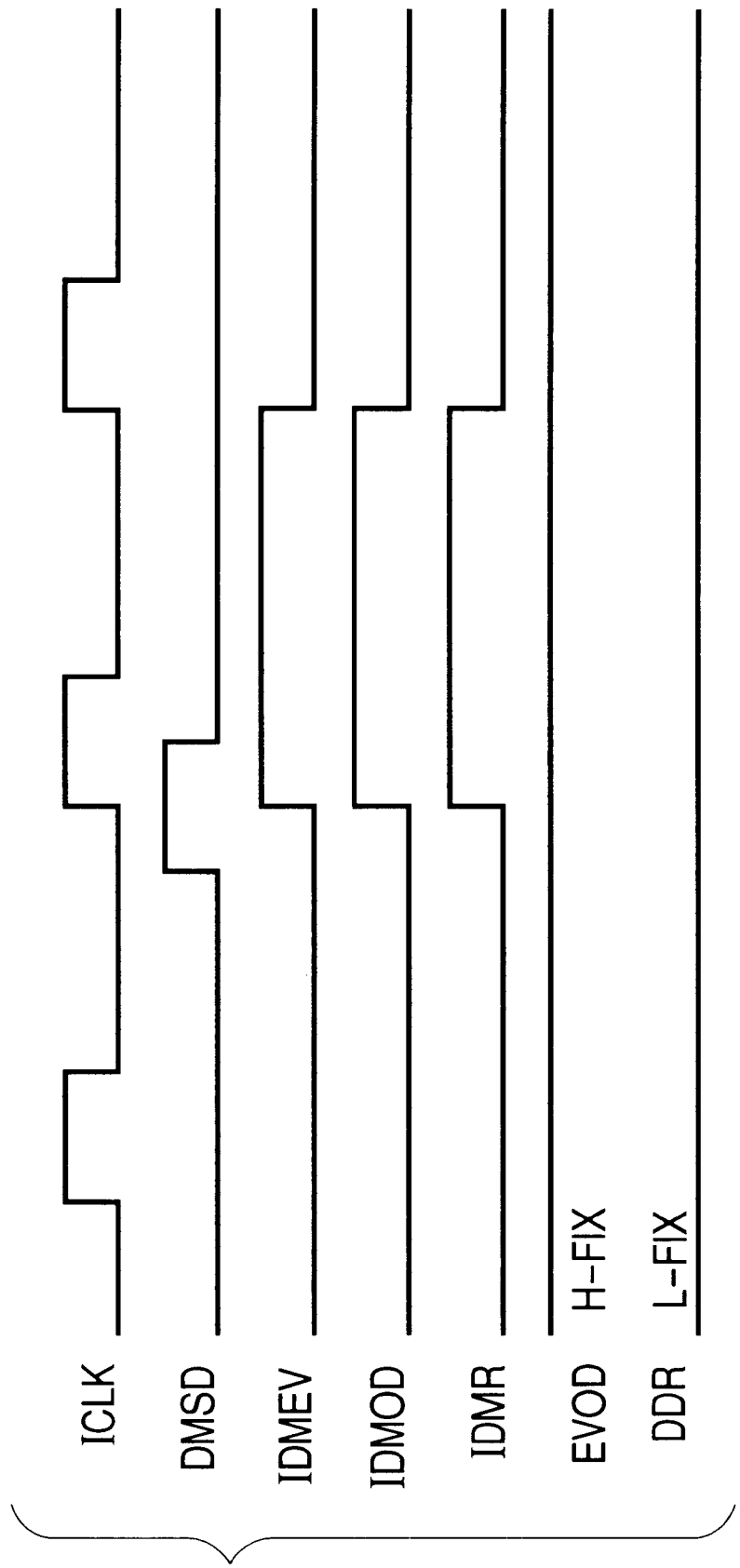
FIG. 5 is a waveform chart showing an example of operations of an SDRAM in the latch of FIGS. 3 and 4.
Figure 6:
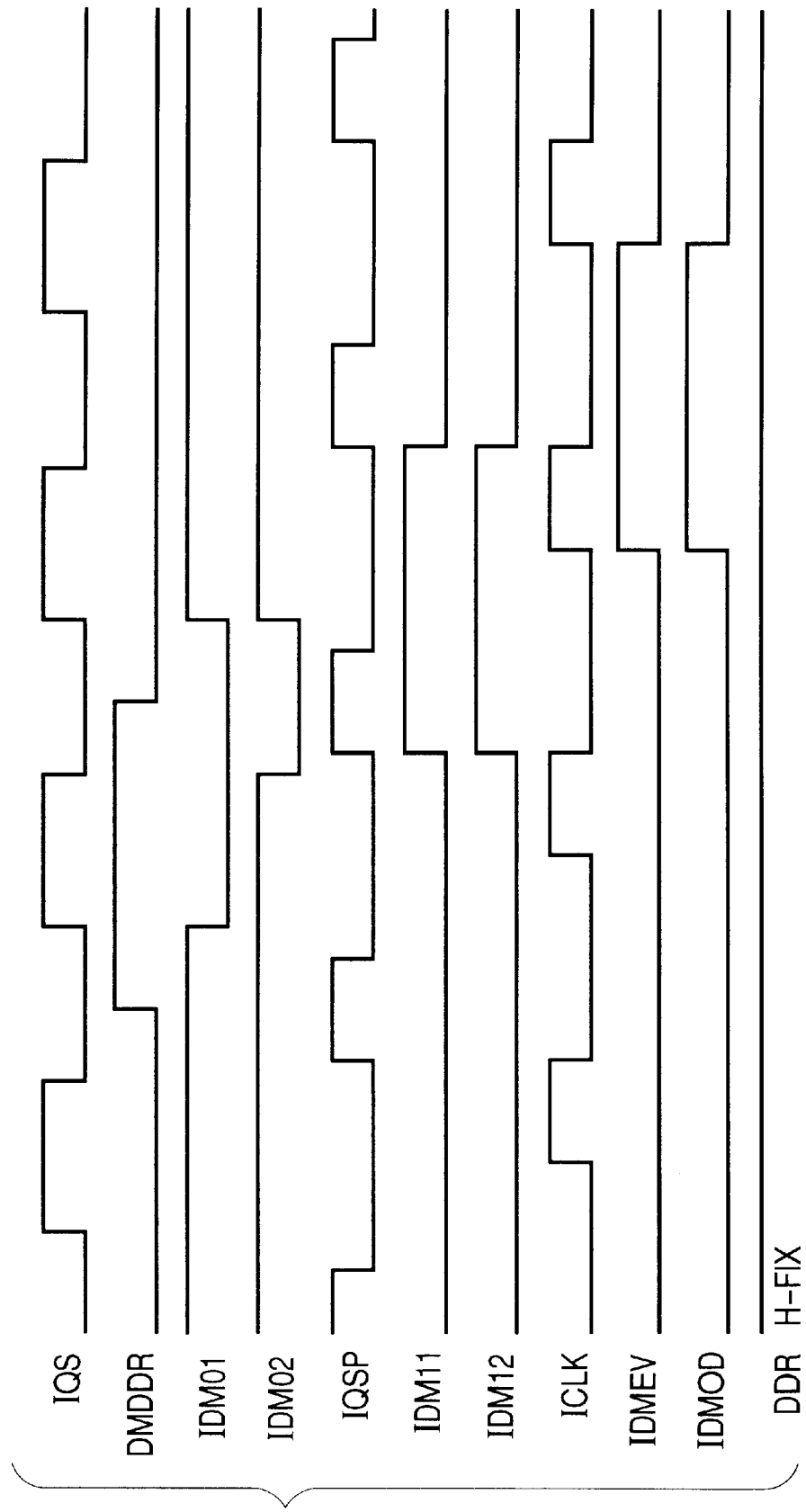
FIG. 6 is a waveform chart showing an example of operations of a DDR-SDRAM in the latch of FIGS. 3 and 4.

FIGS. 3 and 4 are circuit diagrams showing an example of the latch in FIG. 1. FIG. 3 shows the input stage side of the latch and FIG. 4 shows the output stage side of the latch. FIG. 5 is an operation waveform chart in the SDRAM mode. FIG. 6 is an operation waveform chart in the DDR-SDRAM mode.

In FIG. 3, output signals from the two input buffers at the ante stage are indicated by DMDDR and DMSD. The signal DMDDR corresponds to the mask signal DQM(DDR) entered via the pad P1 in the DDR-SDRAM mode. The signal DMSD corresponds to the mask signal DQM(SDR) entered via the pad P2 in the SDRAM mode.

In the SDRAM mode, the signal DMSD is input as the data mask signal DQM. In the SDRAM mode, a decoder output signal DDR of the bonding option is at the L (low) level, and the mask signal DMSD is sent to internal nodes IDM11 and IDM12 via clocked inverters CN5 and CN9 as selection circuits which are made operative by the low level of the decoder output signal DDR sent via delay circuits DELAY and inverters N8 and N15, respectively. The delay circuits DELAY and the inverters N8 and N15 are provided as detours of the latch synchronized with clocks IQS and IQSP provided for the DDR-SDRAM.

In the rear stage side shown in FIG. 4, signals of the internal nodes IDM11 and IDM12 are latched by a latch including an inverter N21 and a clocked inverter CN11 and a latch including an inverter N27, and a clocked inverter CN16, respectively, which operate in response to an internal clock ICLK generated in correspondence with a clock signal CLK supplied from an external terminal, and data mask signals IDMEV and IDMOD for writing control and a data mask signal IDMR for data output control are generated. In FIG. 5, the mask signal DMSD at the high level is input synchronously with the second clock ICLK and captured synchronously with the clock ICLK, and the mask signals IDMEV, IDMOD, and IDMR are generated.

In the DDR-SDRAM mode, the signal DMDDR is input as the data mask signal DQM. In the DDR-SDRAM mode, the data mask signal DQM(DDR) input from the outside is synchronized with a data strobe signal QS so as to correspond to a write signal input from the data terminal DQ. The data mask signal DQM(DDR) is captured by the latch which receives the data strobe signal QS and operates in response to an internal data strobe signal IQS internally generated. In this case, two separate data mask signals DQM(DDR) are transmitted synchronously with the rising and falling edges of the data strobe signal QS. In order to capture the mask signals, although not limited, two latches are provided in parallel.

The first latch includes an inverter N3, a CMOS switch in which a P-channel type MOSFET Q1, an N-channel type MOSFET Q2 are connected in parallel, an inverter N4, a clocked inverter CN1 for feeding back an output signal of the inverter N4 to the input side of the inverter N4, a CMOS switch (constructed by MOSFETs Q3 and Q4) similar to the above CMOS switch, a NAND gate G1 operating as an inverter in the DDR-SDRAM mode in response to the decode signal DDR, and a clocked inverter CN2 for feeding back an output signal of the NAND gate G1 to the input side of the NAND gate G1.

The second latch includes an inverter N11, a CMOS switch (constructed by MOSFETs Q7 and Q8), a NOR gate G2 operating as an inverter in the DDR-SDRAM mode in response to the decode signal DDR, and a clock inverter CN6 for feeding back an output signal of the NOR gate G2 to the input side of the NOR gate G2. The reason why the second latch uses the NOR gate G2 is that the internal node IDM12 is set to the low level to achieve a not-masked state at the time of resetting.

In the first latch, the latch operated synchronously with the clock IQS is constructed in two stages, so that a signal is delayed by one clock and transmitted to the internal node IDMOL. In the second latch, the latch operated synchronously with the clock IQS is constructed in one stage, so that a signal is delayed by a half clock and transmitted to the internal node IDM02. Consequently, the first mask signal DMDDR input synchronously with the rising edge of the clock IQS and the second mask signal DMDDR input synchronously with the falling edge of the clock IQS are transmitted at the same timing to the internal nodes IDM01 and IDM02, respectively.

In the DDR-SDRAM, only the mask signal DQM (DMDDR) is input synchronously with the data strobe signal QS. The other input circuits such as the write buffer receive the clock signal CLK supplied from an external terminal and operate synchronously with the internally generated internal clock signal ICLK. Therefore, the mask signal synchronized with the data strobe signal QS transmitted to the internal nodes IDM01 and IDM02 has to be synchronized with the internal clock signal ICLK.

In the embodiment, the data strobe signal QS is received, and a one-shot pulse signal IQSP is generated. A latch circuit including the CMOS switch (Q5 and Q6), a clocked inverter CN3 having the functions of a selection circuit and a latch, and clocked inverter CN4 for feedback, and a latch circuit including a CMOS switch (Q9 and Q10), a clocked inverter CN7 having the function of a selection circuit and a latch, and a clocked inverter CN8 for feedback are provided. By using the pulse signal IQSP, the signals of the internal nodes IDM01 and IDM02 are held in internal nodes IDM11 and IDM12 as mask signals of the internal nodes IDM01 and IDM02 for a cycle of the data strobe signal QS. The mask signals held in the internal nodes IDM11 and IDM12 are sent to the latches operated on the internal clock signal ICLK on the rear stage side of FIG. 4, and the data mask signals IDMEV and IDMOD for writing control are generated.

In the embodiment, each of the clocked inverters CN3, CN5, CN7, and CN9 provided at the front stage of the internal nodes IDM11 and IDM12 serves as a selection circuit, performs switching between the mask signal DMSD entered in the SDRAM mode and the mask signal DMDDR entered in the DDR-SDRAM mode, and adjusts the timings of the signals entered at different timings. As described above, by rationally performing the timing adjustment and the signal selection, the circuit can be simplified.

In FIG. 6, in a manner similar to the above, the mask signal DMDDR goes high synchronously with the rising and falling edges of the second clock IQS, is captured by the internal node IDM01 synchronously with the rising edge of the clock IQS, and transmitted to the internal node IDM02 synchronously with the falling edge of the clock IQS. The low level of each of the internal nodes IDM01 and IDM02 is held for the period of one clock by the clock IQSP, and the mask signals IDMEV and IDMOD are generated synchronously with the internal clock ICLK.

On the rear stage side of FIG. 4, a control signal EVOD is provided to perform an operation control as follows. In the DDR-SRAM, two write signals input from the outside are sent in a cycle synchronously with the rising and falling edges of the data strobe signal QS. On the inside, in a manner similar to the above-described method, serial-to-parallel conversion is performed, and two data signals are simultaneously written in the memory array synchronously with the rising edge of the internal clock ICLK. Two write paths have to be therefore provided so as to divide the memory array into even-numbered addresses and odd-numbered addresses.

Consequently, to send data supplied synchronously with the rising edge of the data strobe signal QS, one of divided memory arrays has to be selected in accordance with the address (odd or even-number) supplied first from the outside. Such memory array selection is instructed by the signal EVOD. Specifically, the signal IDMEV is a write mask control signal for an even-numbered array, and the signal IDMOD is a write mask control signal for an odd-numbered array. In the SDRAM mode, the signal EVOD is fixed at the high (H) level.

In the DDR-SDRAM mode, when the mask signal DMDDR for an even-numbered address is input synchronously with the rising edge of the clock IQS corresponding to the data strobe signal QS, the signal EVOD goes high. The signal of the internal node IDM11 for capturing the signal EVOD is outputted as the write mask control signal IDMEV for the even-numbered array. The signal of the internal node IDM12 for capturing the mask signal DMDDR entered synchronously with the falling edge is outputted as the write mask control signal IDMOD for the odd-numbered array.

On the contrary, when the mask signal DMDDR corresponding to an odd-numbered address is supplied synchronously with the rising edge of the clock IQS corresponding to the data strobe signal QS, the signal EVOD goes low, and the signal of the internal node IDM11 for capturing the signal EVOD is outputted as the write mask control signal IDMOV for the odd-numbered array. The signal of the internal node IDM12 for capturing the mask signal DMDDR supplied synchronously with the falling edge is outputted as the write mask control signal IDMEV for the even-numbered array.

In the case of the metal option specification as in the embodiment of FIG. 2, by connecting the input nodes DMDDR and the DMSD in FIG. 3, the device can be adapted to both the SDRAM mode and the DDR-SDRAM mode.

Figure 7:
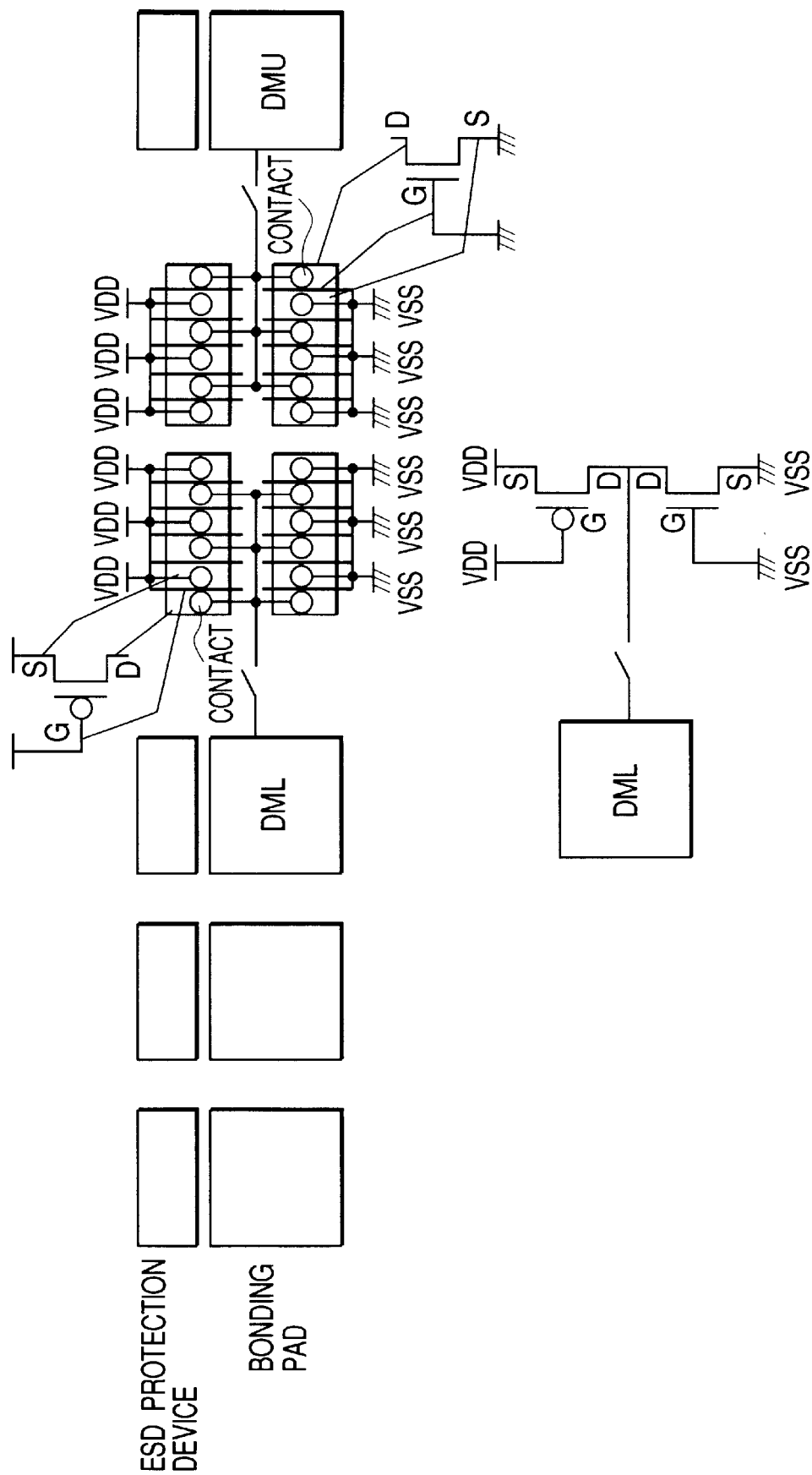
FIG. 7 is a configuration diagram showing an example of a bonding pad portion of the semiconductor memory device according to the invention.

FIG. 7 is a configuration diagram of an example of a bonding pad portion in the semiconductor memory device according to the invention. The example is adapted to the metal option specification of FIG. 3. Capacitors added in the DDR-SDRAM mode are arranged between bonding pads DML and DMU. The upper capacitors are P-channel type MOS capacitors, and the lower capacitors are N-channel type MOS capacitors. As the P-channel type MOS capacitor and the N-channel type MOS capacitor, the same P-channel type output MOSFET and N-channel type output MOSFET in the output circuit are used.

Diffusion layers serving as a source S and a drain D are isolated by a first polysilicon layer FG constructing a gate electrode G. The diffusion layers are sequentially arranged as the drain, source, drain, and source from the lower side of the drawing. Circles shown in the source S and the drain D denote contact holes. The source S and the gate G of the P-channel type MOSFET are connected to the source voltage VDD as shown in an equivalent circuit. The source S and the gate G of the N-channel type MOSFET are connected to the ground potential VSS of the circuit as shown in the equivalent circuit. The drains D are connected to each other and are selectively connected to the bonding pad DML or DMU.

The embodiment is directed to a DRAM adapted to the ×16 bit configuration, and two mask signals of a mask signal DMU for upper eight bits for data masking and a mask signal DML for lower eight bits are provided. The mask signal DMU is for the data terminals DQ8 to DQ15 and the mask signal DML is for the data terminals DQ0 to DQ7. In such a DRAM in the ×16 bit configuration, in the case of switching an input capacitance by bonding option, two pads are provided for the SDRAM and the DDR-SDRAM.

In the capacitor portion of FIG. 7, the gate electrode FG is shown by a vertical thick line. By using the gate electrode FG, the capacitor is divided (into the source and drain). As compared with the case where the diffusion layer L itself is divided, the layout area can be made smaller, and fine adjustment of the capacitance is facilitated. The capacitance is adjusted by cutting a metal line shown by a lateral thin line in a desired position and fixing the metal line which is not connected to the pad to the power source.

The input capacitance of the mask signal input circuit is adjusted to the input capacitance of the data terminal DQ. By constructing the input buffer by using the same circuit as the data input circuit, an insufficient capacitance amount corresponds to the drain diffusion layer of the output MOSFET in the data output circuit. In the data output circuit, a plurality of output MOSFETs are formed like the MOS capacitors in the drawing so that an output current becomes a desired current. By selecting the number of output MOSFETs, desired current supply capability is obtained. In the embodiment, therefore, by using the same MOSFET as the output MOSFET, the insufficient capacity amount in the DDR-SDRAM mode is compensated by adjusting the number of the MOSFETs connected. In the input circuit for inputting command and data, if capacitors for fine adjustment are prepared so that the input capacity of the input circuit lies within a standard range, capacitors for fine adjustment similar to the above can be provided also for the input circuit of the mask signal.

Figure 8:
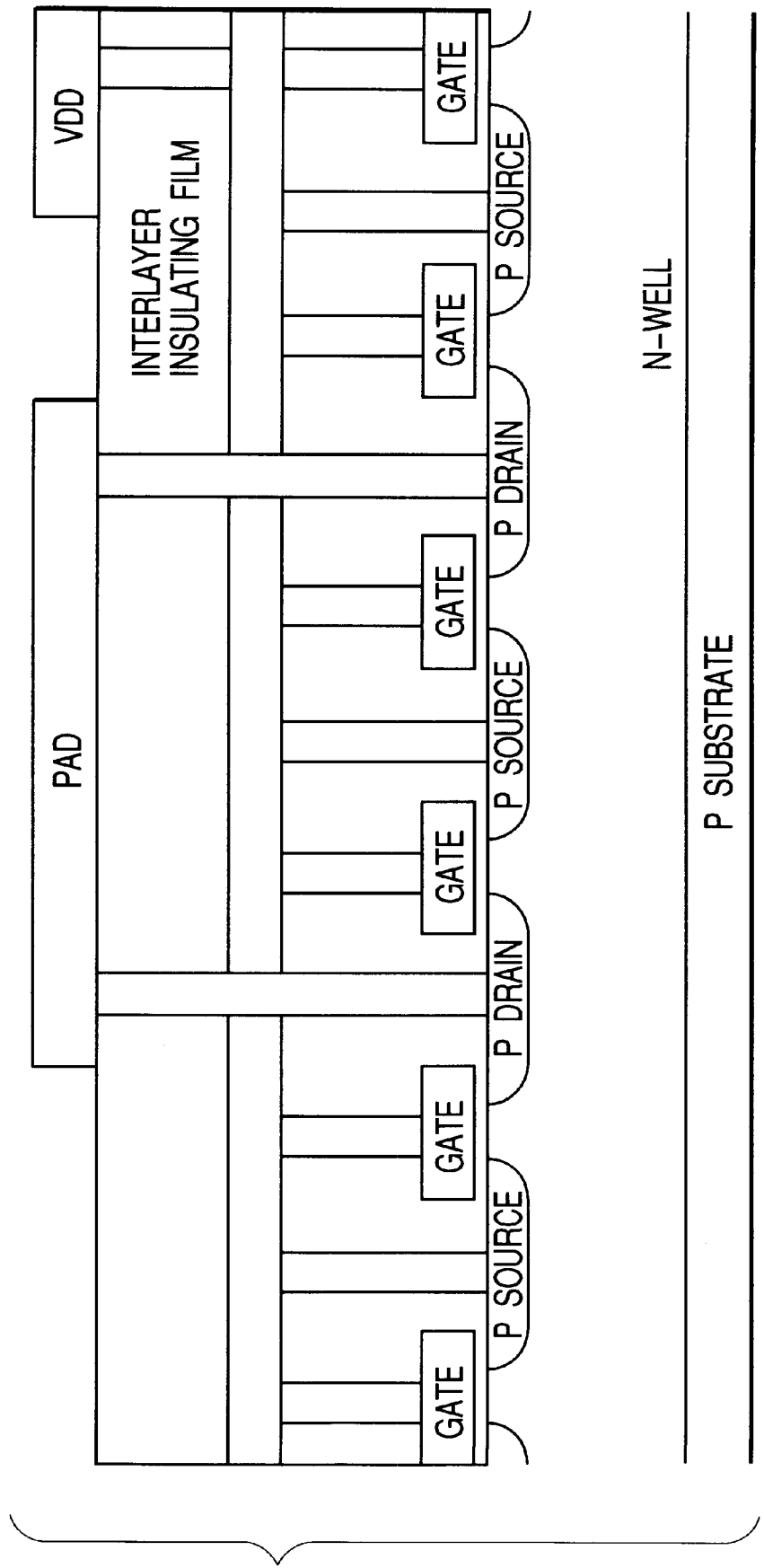
FIG. 8 is a cross section showing another example of capacitors provided for the bonding pad portion in the semiconductor memory device according to the invention.

FIG. 8 is a cross section showing another example of capacitors provided for a bonding pad portion in the semiconductor memory device according to the invention. In the example, a state of a transversely cut portion of a P-channel type MOS capacitor portion provided under a bonding pad PAD is shown. A diffusion layer (drain) connected via a line to the pad PAD is added as a capacitance. The gate and source of a P-channel type MOSFET are connected to the source supply line VDD. By effectively using the underlayer of the pad PAD as the capacitance for adjustment, the occupied area of the mask input circuit can be reduced.

Figure 9:
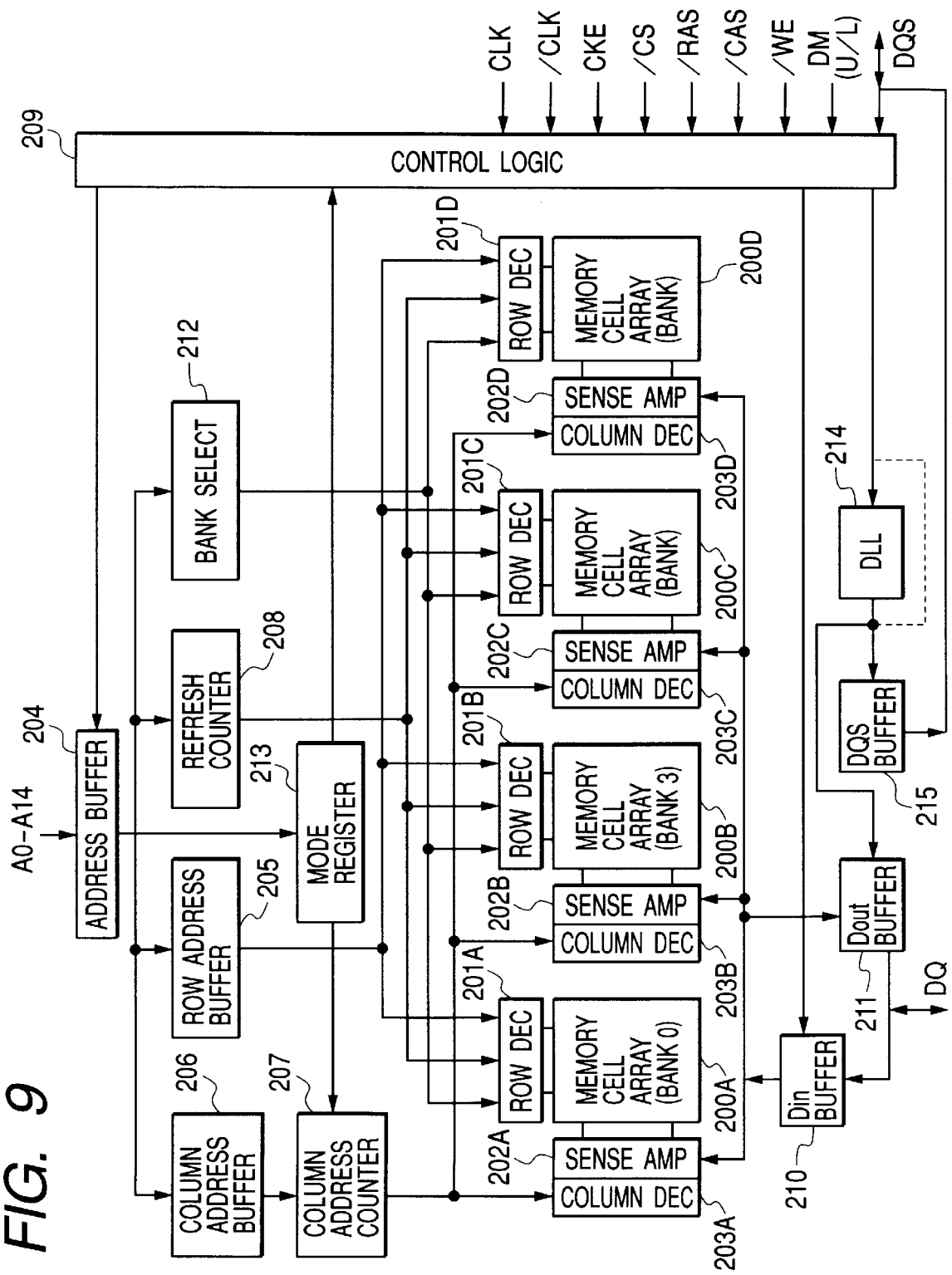
FIG. 9 is a general block diagram showing an example of a DDR-SDRAM to which the invention is applied.

FIG. 9 is a general block diagram of an example of a DDR-SDRAM (Double Data Rate Synchronous Dynamic Random Access Memory) to which the invention is applied. In the DDR-SDRAM of the example, although not limited, four memory arrays 200A to 200D are provided in correspondence with four memory banks. Each of the memory arrays 200A to 200D corresponding to memory banks 0 to 3 has dynamic memory cells arranged in a matrix. According to the drawing, a selection terminal of memory cells arranged in the same column is coupled to a word line (not shown) for each column. Data input/output terminals of memory cells arranged in the same row are coupled to complementary data lines (not shown) every row.

One of word lines (not shown) in the memory array 200A is driven to the selection level in accordance with a result of decoding of a row address signal by a row decoder 201A. A not-illustrated complementary data line in the memory array 200A is coupled to an I/O line of a sense amplifier 202A and a column selection circuit 203A. The sense amplifier 202A is an amplifier for detecting and amplifying a small potential difference appearing on each complementary data line by reading data from a memory cell. The column selection circuit 203A includes a switch circuit for selecting the complementary data line and making the selected complementary data line to be conducted to a complementary I/O line. The column switch is selected in accordance with a result of decoding of the column address signal by the column address decoder 203A.

Memory arrays 200B to 200D are similarly provided with row decoders 201B to 201D, sense amplifiers 203B to 203D, and column selection circuits 203B to 203D, respectively. The complementary I/O line is commonly used by the memory banks and connected to an output terminal of a data input circuit 210 having a write buffer and an input terminal of a data output circuit 211 including a main amplifier. The terminal DQ is, although not limited, a data input/output terminal for inputting/outputting data D0 to D15 of 16 bits. A DQS buffer 215 generates a data strobe signal of read data output from the terminal DQ.

Address signals A0 to A14 supplied from an address input terminal are once held by an address buffer 204. Out of the address signals time-sequentially supplied, row address signals are held in a row address buffer 205, and column address signals are held in a column address buffer 206. A refresh counter 208 generates a row address used at the time of automatic refresh and self refresh.

For example, in the case where the device has a storage capacity of 256 Mbits, as column address signals, address signals A0 to A9 are valid in the ×16-bit configuration. In the case where the device has a storage capacity of 64 Mbits, in the ×16-bit configuration, address signals A0 to A8 are valid. An output of the column address buffer 206 is supplied as preset data of a column address counter 207. In a burst mode designated by a command or the like which will be described hereinlater, the column address counter 207 outputs the column address signal as the preset data or a value obtained by sequentially incrementing the column address signal toward the column decoders 203A to 203D.

A mode register 213 holds various operation mode information. Only one of the row decoders 201A to 201D which corresponds to a bank designated by a bank select circuit 212 operates to select a word line. To a control circuit (control logic) 209, although not limited, external control signals such as clock signals CLK and /CLK (the "/" designation indicates that the signal is active low), a clock enable signal CKE, a chip select signal /CS, a column address strobe signal /CAS, a row address strobe signal/RAS, and a write enable signal /WE, /DM (U/L), and address signals sent via the mode register 213 are supplied. On the basis of the level change, timing, and the like of each of the signals, an internal timing signal for controlling the operation mode of the DDR-SDRAM and the operation of the circuit block is generated. An input buffer corresponding to each of the signals is provided.

The clock signals CLK and /CLK are input to a DLL circuit 214 as described above via a clock buffer, and an internal clock is generated. The internal clock is, but not limited, used as an input signal of the data output circuit 211 and the DQS buffer 215. The clock signal input via the clock buffer is supplied to the data input circuit 210 and a clock terminal from which the signal is supplied to the column address counter 207.

The other external input signals become significant synchronously with the rising edge of the internal clock signal. The chip select signal /CS instructs start of a command input cycle when it goes low. The chip select signal /CS at the high level (chip non-selected state) and other inputs are insignificant. A selection state of the memory bank and internal operations such as a burst operation are not influenced by a change to the chip non-selection state. The signals /RAS, /CAS, and /WE have functions different from those of corresponding signals in a normal DRAM and become significant when a command cycle which will be described hereinafter is defined.

The clock enable signal CKE is a signal for instructing validity of the following clock signal. When the signal CKE is at the high level, the rising edge of the following clock signal CLK is valid. When the signal CKE is at the low level, the rising edge is invalid. In the reading mode, in the case of providing an external control signal /OE for performing an output enable control on the data output circuit 211, the signal /OE is also supplied to the control circuit 209. When the signal /OE is, for example, at the high level, the data output circuit 211 enters a high output impedance state.

The row address signal is defined by the levels of A0 to A11 in a row address strobe/bank active command cycle which will be described hereinlater synchronized with the rising edge of the clock signal CLK (internal clock signal). The address signals A12 and A13 are regarded as bank selection signals in the row address strobe/bank active command cycle. Specifically, according to a combination of the address signals A12 and A13, one of the four memory banks 0 to 3 is selected. The memory bank selecting control is performed, but not limited, by a process of activating only the row decoder on the selected memory bank side, selecting no column switches on the not-selected memory banks, connecting only the selected memory bank side to the data input circuit 210 and the data output circuit, or the like.

When the device has 256 Mbits and the ×16-bit configuration as described above, the column address signal is defined by the levels of the address signals A0 to A9 in the read or write command (column address read command or column address write command which will be described hereinlater) cycle synchronized with the rising edge of the clock signal CLK (internal clock). The column address defined as described above is used as a start address of a burst access.

In the DDR-SDRAM, during a burst operation is performed in a memory bank, when another memory bank is designated and a row address strobe/bank active command is supplied, a row address related operation can be performed in the another memory bank without exerting any influence on the operation in the memory bank in which the burst operation is being executed. Therefore, for example, as long as data D0 to D15 does not collide with each other at the data input/output terminal DQ of 16 bits, during a command is being executed, a precharge command or a row address strobe/bank active command can be issued to a memory bank different from the memory bank which is processed by the command being executed to preliminarily start an internal operation.

The reading operation of the DDR-SDRAM will be described as follows. The chip select signal /CS, /RAS, /CAS, and write enable signal /WE are input synchronously with the clock signal CLK. When 0 is set in /RAS, a row address and a bank selection signal are input and held by the row address buffer 205 and the bank select circuit 212, respectively. The row decoder 210 designated by the bank select circuit 212 decodes the row address signal, and data of the whole row is outputted as a signal having a small amplitude from the memory cell array 200. The small amplitude signal outputted is amplified by the sense amplifier 202 and the amplified signal is held. The designated bank becomes active.

After three clocks CLK since the row address is input, when 0 is set in the signal CAS, a column address and a bank select signal are input and held in the column address buffer 206 and the bank select circuit 212, respectively. When the designated bank is active, the held column address is output from the column address counter 207, and the column decoder 203 selects a column. Selected data is output from the sense amplifier 202. Two sets of data is output at this time (32 bits in the ×16 bit configuration).

The data output from the sense amplifier 202 is output from the data output circuit 211 to the outside of the chip. Output timings are synchronized with both the rising and falling edges of the internal clock signal QCLK output from the DLL 214. The two sets of data are parallel-to-serial converted, resulted in data of (1 set×2). On output of the data, the data strobe signal DQS is output from the DQS buffer 215. When the burst length stored in the mode register 213 is four or longer, the address of the column address counter 207 is automatically incremented and the following column data is read.

The role of the DLL 214 is to generate the operation clock QCLK of the data output circuit 211 and the DQS buffer 215. In the data output circuit 211 and the DQS buffer 215, it takes some time since the internal clock signal QCLK generated by the DDL 214 is input until a data signal and a data strobe signal are actually output. Consequently, the phase of the internal clock signal QCLK is advanced more than the external clock CLK by using a replica circuit to make the phase of the data signal and that of the data strobe signal coincide with that of the external clock CLK. In this case, therefore, the phase of the external clock signal coincides with that of the data signal and that of the data strobe signal.

In the case of operating the device as the SDRAM, other than the substantial switch of the input capacitance of the data mask DM as described above, since the DLL 214 becomes unnecessary, a signal bypass shown by a broken line in the diagram is provided. In order to reduce waste current consumption in the DLL, the power source itself is interrupted. In the metal option specification, such interruption of the power source can be easily carried out.

Figure 10:
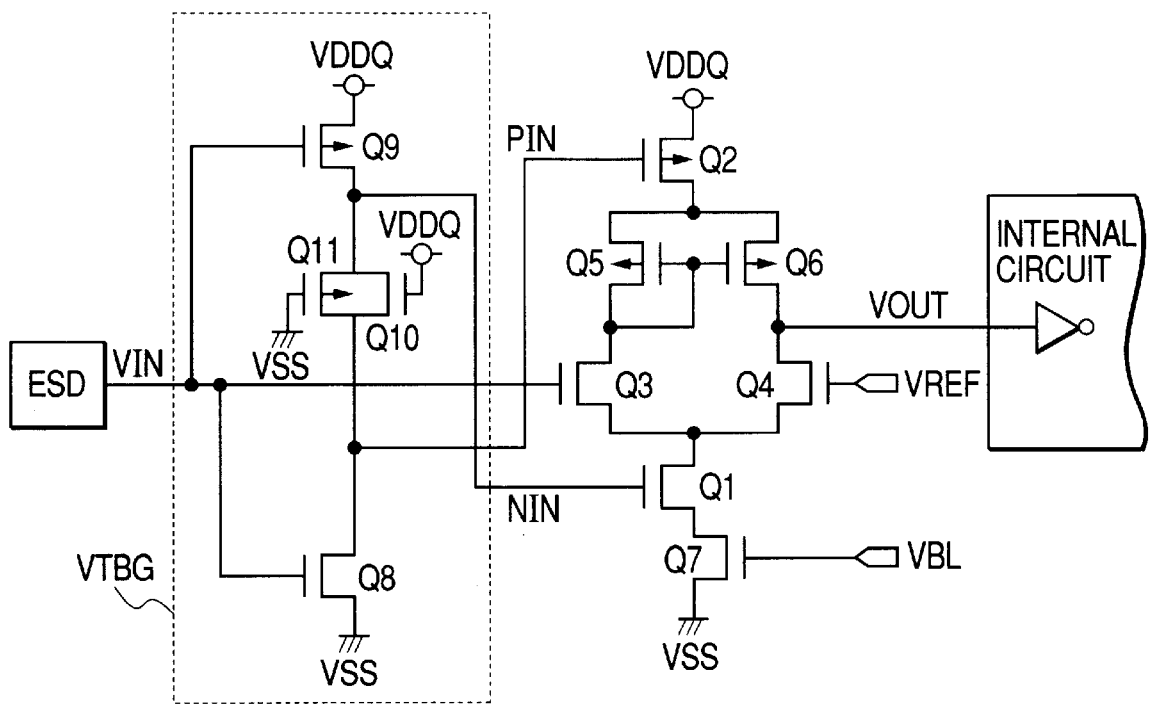
FIG. 10 is a circuit diagram showing an example of an input circuit of the semiconductor memory device according to the invention.

FIG. 10 is a circuit diagram showing an example of an input circuit of the semiconductor memory device according to the invention. For simplicity of the drawing, reference numerals given to MOSFETs in FIG. 10 partly overlap with those in FIGS. 3 and 4. However, the MOSFETs realize different circuit functions.

A differential amplifier is constructed by connecting P-channel type load MOSFETs Q5 and Q6 in a current mirror form to the drain sides of N-channel type differential MOSFETs Q3 and Q4 having gates to which an input voltage VIN and a reference voltage VREF are supplied, respectively, and providing an N-channel type current source MOSFET Q7 on the common source side via an N-channel type switch MOSFET Q1. The ground potential VSS of the circuit is given to the source of the current source MOSFET Q7, and a constant voltage VBL is supplied to the gate. Between the common source of the P-channel type MOSFETs Q5 and Q6 of the current mirror form and the source voltage VDDQ, a P-channel type switch MOSFET Q2 is provided.

An input voltage tracking type bias voltage generating circuit VTBG includes an N-channel MOSFET Q8 and a P-channel type MOSFET Q9 having gates to which the input signal VIN is supplied and sources to which the ground potential VSS and the source voltage VDDQ are supplied, and an N-channel type MOSFET Q10 and a P-channel type MOSFET Q11 connected in parallel and acting as high resistive elements between the drains of the MOSFETs Q8 and Q9. The source voltage VDDQ is steadily supplied to the gate of the N-channel type MOSFET Q10. The ground potential VSS of the circuit is steadily supplied to the gate of the P-channel type MOSFET Q11 so as to operate as a resistive element. A bias voltage of a node PIN to be transmitted from the drain of the N-channel type MOSFET Q8 to the gate of the P-channel type MOSFET Q2 is outputted, and a bias voltage of a node NIN to be transmitted from the drain of the N-channel type MOSFET Q9 to the gate of the N-channel type MOSFET Q1 is outputted.

Figure 11:
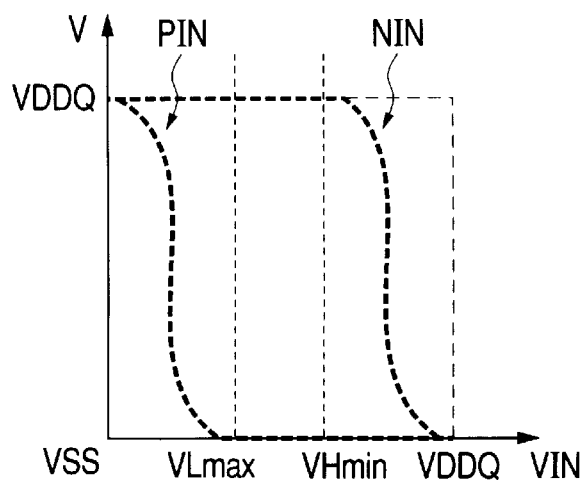
FIG. 11 is an input/output transmission characteristic diagram for explaining the operation of the input circuit of FIG. 10.

The input voltage tracking type bias voltage generating circuit VTBG can be regarded as a combination of the N-channel type driving MOSFET Q8 and the P-channel type driving MOSFET Q9 for receiving the input voltage VIN and an inverter as a high resistance load circuit provided for the drains of Q8 and Q9. Consequently, input/output transmission characteristics of the N-channel type MOSFET Q8 and the inverter as a high resistance load circuit are as shown in FIG. 11. When the input voltage VIN becomes equal to or higher than the threshold voltage of the N-channel type MOSFET Q8, the MOSFET Q8 is turned on to sharply reduce a control voltage transmitted from the drain to the node PIN from VDDQ to the low level such as the ground potential VSS of the circuit.

Input/output transmission characteristics of the P-channel type MOSFET Q9 and the inverter as a high resistance load circuit are as shown in FIG. 11. Since the difference between the input voltage VIN and the source voltage VDDQ is applied across the source and gate of the P-channel type MOSFET Q9, when the difference voltage becomes below the threshold voltage of the P-channel MOSFET Q9, the MOSFET Q9 is turned off, and the control voltage transmitted from the drain to the node NIN is reduced from the source voltage VDDQ to the low level such as the ground potential VSS of the circuit. By using a high resistive element as a path gate in the input voltage tracking type bias voltage generating circuit VTBG, a static characteristic as shown in FIG. 11 is obtained in the nodes PIN and NIN.

In the case of inputting a signal of a small amplitude like SSTL, by the low level of the node PIN and the high level of the node NIN, the switch MOSFETs Q2 and Q1 are turned on. Since the operation current is always passed to the differential amplifier, an amplifying action using, as an input, a difference voltage between the input signal VIN and a reference voltage VREF corresponding to the logic threshold voltage of SSTL is performed.

In the case where the input signal VN has a full amplitude (VDDQ–VSS) and is fixed at, for example, VDDQ, both the nodes PIN and NIN are equal to VSS, the P-channel type MOSFET Q2 is fixed in an ON state, and the N-channel type MOSFET Q1 is turned off. Consequently, the differential amplifier stops operating. By the high level of the input signal VIN, in a transient state until the N-channel type MOSFET Q1 is turned off, the differential MOSFET Q3 is in an ON state to make the MOSFETs Q5 and Q6 in the ON state. When the P-channel MOSFET Q2 enters the ON state, an output VOUT at a high level like the source voltage VDDQ can be outputted.

When the N-channel type MOSFET Q10 and the P-channel type MOSFET Q11 are connected in parallel as the high resistance load device, no level loss occurs in the threshold voltage of the MOSFETs. The node PIN can be changed to the high level like the source voltage VDDQ, and the node NIN can be changed to the low level like the ground potential VSS of the circuit. Consequently, when the input signal VIN has a full amplitude and is fixed to VDDQ or VSS, the switch MOSFET Q1 or Q2 can be turned off with reliability. Thus, current consumption in the differential amplifier can be reduced.

When the N-channel type switch MOSFET Q1 is turned off by the low level of the node NIN, the differential amplifier stops its amplifying operation but the output signal VOUT is maintained at the high level. Since the P-channel type MOSFET Q9 in the input voltage tracking type bias voltage generating circuit VTBG is also turned off at this time, no through current is passed. Therefore, the current consumption of the entire input circuit constructed by the differential amplifier and the bias voltage generating circuit becomes theoretically zero.

Figure 12:
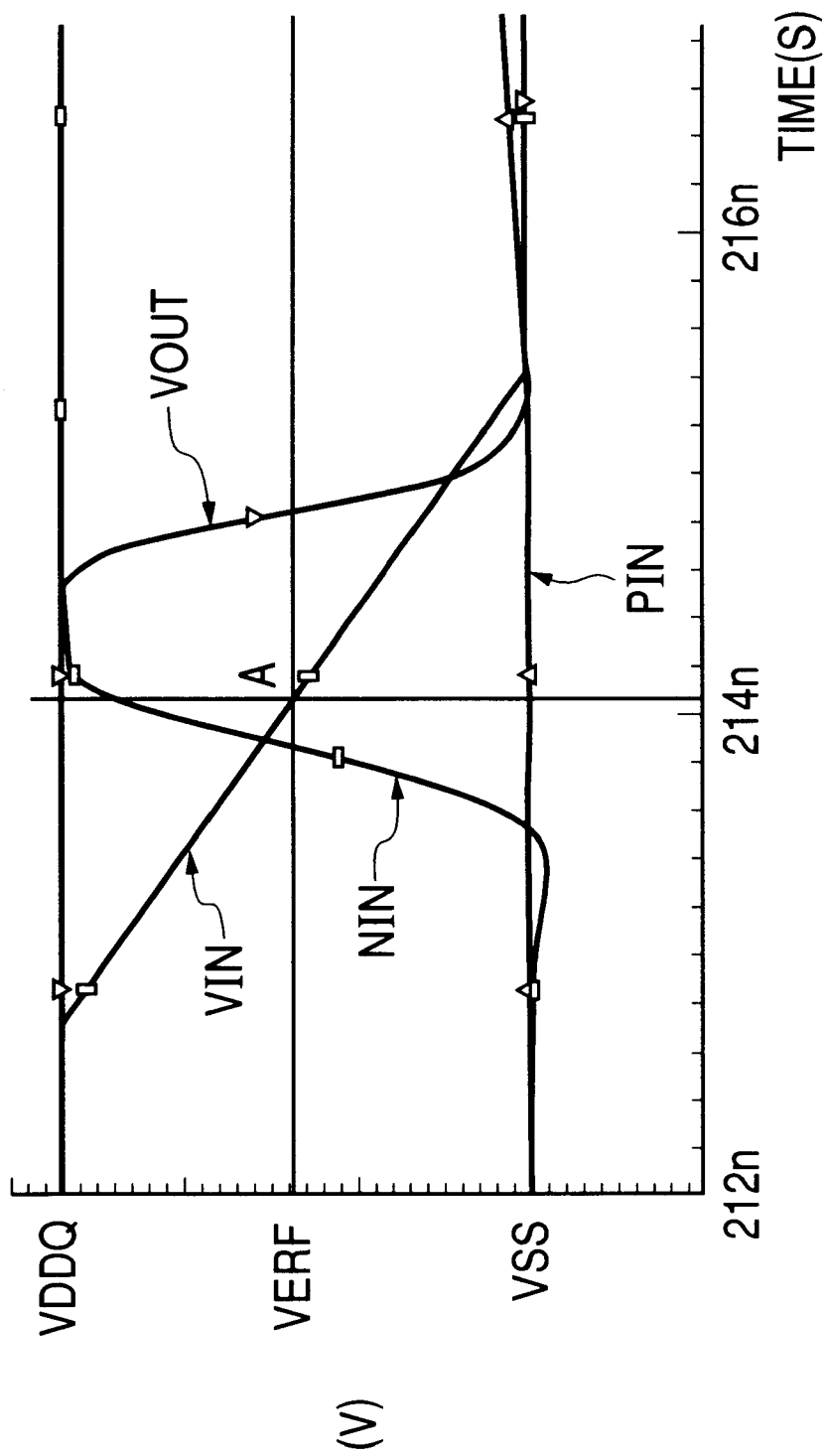
FIG. 12 is a waveform chart formed from a simulation result for explaining the operation of the input circuit of FIG. 10.

It means that the current of the input circuit of address, command, and data can be reduced in an idle standby mode of a semiconductor integrated circuit device such as a DRAM. Further, when the input signal falls to VSS from a state where it is fixed at VDDQ, as shown in a waveform chart of FIG. 12 formed on the basis of a result of simulation, only the node NIN which has been decreased to VSS until then is promptly increased to VDDQ. Immediately after the switch MOSFET Q1 is turned on, the amplifying operation of the differential amplifier is restarted.

Specifically, when the input signal VIN changes from the state where it is fixed to VDDQ to the low level in response to an input signal like LVTTL, before the level of the input signal VIN reaches a center voltage VREF, the node NIN goes high to make the differential amplifier operative. Consequently, when the input signal VIN drops below the reference voltage VREF, the output signal VOUT accordingly changes from the high level to the low level, so that an output signal OUT equivalent to that of the LVTTL interface can be generated. Also in the case where the input signal rises from VSS to VDDQ, by a similar principle, the differential amplifier can be switched from a non-operative state to the amplifying operation state.

The circuit of the embodiment stably operates with an input of a small amplitude like SSTL and also has the characteristic of a CMOS input buffer such that the current consumption is reduced to zero when the input signal has a full amplitude and is fixed at VDDQ or VSS. The circuit can be therefore used commonly for all of interfaces including SSTL and LVTTL. The input circuit is therefore useful in the case where the SDRAM having both types of SSTL and VLTTL and the DDR-SDRAM using only SSTL are formed on the same chip and either the SDRAM or the DDR-SDRAM is selected by bonding option or metal option described above.

Although FIG. 10 shows an example using the differential amplifier in which the N-channel type MOSFETs like the differential MOSFETs Q3 and Q4 receive the voltages, a differential amplifier in which P-channel type MOSFETs receive voltages may be also used. Generally, in the differential amplifier in which N-channel type MOSFETs receive voltages, both the maximum and minimum values of the output amplitude increase depending on the source voltage. Since the minimum value of the amplitude shifts to an intermediate potential side of the operation voltage of an inverter at the next stage, a through current to the inverter at the next stage increases. On the contrary, in the differential amplifier in which the P-channel type MOSFETs receive voltages, the minimum value is almost constantly VSS, so that the through current to the inverter at the next stage can be suppressed.

Action and effects obtained from the embodiment are as follows.

(1) In a semiconductor memory device in which an access to any of the memory cells is designated according to a command, and a common data terminal is used as an input terminal and an address signal input terminal to which a write signal to the memory cell is input and an output terminal from which a read signal from the memory cell is output, a first input circuit having input capacitance corresponding to the input terminal and the address signal input terminal to which the command is input and a second input circuit having input capacitance corresponding to the data terminal are formed. By inputting a mask signal for checking a write signal input from the data terminal is input by either the first or second input circuit by a bonding option technique, the semiconductor memory device adapted to two kinds of input specifications can be formed on the same chip. Thus, an effect such that improvement in developed TAT and reduction in product cost as a total can be realized is produced.

(2) In addition to the above, the input capacitance of the second input circuit is obtained by adding drain diffusion capacitance of a dummy output MOSFET corresponding to the output circuit from which the read signal is output to input capacitance of an input circuit equivalent to the input circuit to which the write signal is input. Consequently, effects such that compatibility of input capacitance with the data terminal can be achieved, and an improved operation margin is attained are produced.

(3) In addition to the above, the output circuit from which the read signal is output includes a plurality of MOSFETs connected in parallel corresponding to required current supply capability, and the dummy output MOSFET added to the second input circuit also includes MOSFETs which are connected in parallel and are equivalent to those of the output circuit. With the configuration, effects such that capability of driving the output circuit provided at the data terminal can be easily set, and compatibility of the input capacitance can be obtained in association with the adjustment of the driving capability are produced.

(4) In addition to the above, the command is input in response to a first clock, a signal input/output to/from the data terminal is input or output in response to a second clock having a phase different from that of the first clock, an output signal of the second input circuit is latched by a latch synchronized with the second clock, and the output signal and an output of the first input circuit are selectively transmitted to a first node, and a signal of the first node is latched by a latch synchronized with the first clock. By commonly using the signal path adapted to two kinds of input specifications, the rear stage side circuit can be shared. Thus, an effect such that the circuit can be simplified is produced.

(5) In addition to the above, the memory cell is a dynamic memory cell including a storage capacitor and an address selection MOSFET, and by the bonding option technique, the first input circuit is set as a circuit for inputting a mask signal to form an SDRAM, or a second input circuit is set as a circuit for inputting a mask signal to form a DDR-SDRAM. With the configuration, both the SDRAM and the DDR-SDRAM can be realized on the same chip. An effect that various advantages such as improvement in developed TAT and reduction in production cost as a total can be obtained is produced.

(6) In a semiconductor memory device in which an access to any of the memory cells is designated according to a command, and a common data terminal is used as an input terminal to which a write signal to the memory cell is input and an output terminal from which a read signal from the memory cell is output, an input circuit having addition capacitance corresponding to a difference between first input capacitance corresponding to the input terminal to which the command is input and second input capacitance corresponding to the data terminal is formed. By a metal option technique, the addition capacitance is not connected in a configuration of inputting the mask signal in response to the command, or the addition capacitance is connected to the input circuit in a configuration of inputting the mask signal in response to the write signal. With the configuration, an effect such that the semiconductor memory device adapted to two kinds of input specifications can be formed on the same chip, and improvement in developed TAT and reduction in product cost as a total can be realized is produced.

(7) In addition to (6), in the configuration of inputting the mask signal in response to the command, the addition capacitance is connected between source terminals in place of the input circuit by the metal option technique. Thus, an effect such that the power source can be stabilized by effectively using the device is produced.

(8) In addition to (6), as the input capacitance of the second input circuit is obtained by adding drain diffusion capacitance of a dummy output MOSFET corresponding to the output circuit from which the read signal is output to input capacitance of an input circuit equivalent to the input circuit to which the write signal is input. With the configuration, effects such that compatibility of input capacitance with the data terminal can be obtained and an improved operation margin can be attained are produced.

(9) In addition to the above (6 to 8), the output circuit from which the read signal is output includes a plurality of MOSFETs connected in parallel corresponding to required current supply capability, and the dummy output MOSFET added to the second input circuit also includes MOSFETs which are connected in parallel and are equivalent to those of the output circuit. With the configuration, effects such that capability of driving the output circuit provided at the data terminal can be easily set, and compatibility of the input capacitance can be obtained in association with the adjustment of the driving capability are produced.

(10) In addition to the above (6 to 9), the command is input synchronously with a first clock, a signal input or output to/from the data terminal is input or output synchronously with a second clock having a phase different from that of the first clock, either a signal latched by a latch synchronized with the second clock or an output passed through the latch is selectively transmitted as an output signal of the input circuit to a first node, and a signal of the first node is latched by a latch synchronized with the first clock and used as an internal mask signal for checking the writing. By commonly using the signal path adapted to two kinds of input specifications, the rear stage side circuit can be shared. Thus, an effect such that the circuit can be simplified is produced.

(11) In addition to the above (6 to 10), the memory cell is a dynamic memory cell including a storage capacitor and an address selection MOSFET, and by the metal option technique, an SDRAM is formed by a setting the first input circuit as a circuit for inputting a mask signal, or a DDR-SDRAM is formed by setting the second input circuit as the circuit for inputting the mask signal. With the configuration, the SDRAM and the DDR-SRAM can be realized on the same chip. Thus, effects such that various advantages such as improvement in developed TAT and reduction in product cost as a total can be obtained are produced.

Although the invention achieved by the inventors has been concretely described above on the basis of the examples, the invention is not limited to the foregoing examples but can be variously modified within a range not departing from the gist of the invention. For example, the memory circuit is not limited to a memory circuit using dynamic memory cells as described above, but a memory circuit using static memory cells can be also used. In the case of applying the invention to a DRAM, the memory array is not limited to what is called a "two-intersection architecture" or "folded bit line architecture" in which a pair of complementary bit lines extend in parallel, but what is called a "single-intersection architecture" or "open bit line architecture" in which complementary bit lines extend on the right and left sides with respect to a sense amplifier as a center may be also used.

In the SDRAM and the DDR-SDRAM formed on the same chip, the input/output interfaces may be limited to the SSTL. That is, an SDRAM having the LVTTL interface is formed on another chip. By limiting the interface as described above, the input circuit can be simplified. The setting of the SDRAM or DDR-SDRAM may be done by using both the bonding option technique and the metal option technique. The invention can be widely used for semiconductor memory devices. Not only the bonding option and metal option, an electric fuse such as disconnecting fuse, anti-fuse, EEPROM, flash memory or the like may be also used.

Effects obtained by representative inventions of the inventions disclosed in the application will be briefly described as follows. In a semiconductor memory device in which an access to a memory cell is designated according to a command, and a common data terminal is used as an input terminal to which a write signal to the memory cell is input and an output terminal from which a read signal from the memory cell is output, a first input circuit having input capacitance corresponding to the input terminal to which the command is input and a second input circuit having input capacitance corresponding to the data terminal are formed. A mask signal for checking the write signal input from the data terminal is input by either the first or second input circuit by a bonding option technique. With the configuration, the semiconductor memory device adapted to two kinds of input specification can be formed on the same chip, and improvement in developed TAT and reduction in product cost as a total can be realized.

In a semiconductor memory device in which an access to any of the memory cells is designated according to a command, and a common data terminal is used as an input terminal to which a write signal to the memory cell is input and an output terminal from which a read signal from the memory cell is output, an input circuit having addition capacitance corresponding to a difference between first input capacitance corresponding to the input terminal to which the command is input and second input capacitance corresponding to the data terminal is formed. By a metal option technique, the addition capacitance is not connected in a configuration of inputting the mask signal in response to the command, or the addition capacitance is connected to the input circuit in a configuration of inputting the mask signal in response to the write signal. With the configuration, the semiconductor memory device adapted to two kinds of input specification can be formed on the same chip, and improvement in developed TAT and reduction in product cost as a total can be realized.

We claim:

1. A semiconductor memory device comprising:
a plurality of memory cells, in which an access to any of said memory cells is designated according to a command;
a data terminal being used as an input terminal to which a write signal to said memory cell is input or being used as an output terminal from which a read signal from said memory cell is output;
a first input circuit having input capacitance corresponding to the input terminal to which a signal relating to said command is input; and
a second input circuit having input capacitance corresponding to said data terminal,
wherein said first or second input circuit can be set as an input circuit of a mask signal for checking writing of the write signal input from said data terminal into said memory cell by a bonding option technique.

2. The semiconductor memory device according to claim 1,
wherein the input capacitance of said second input circuit is obtained by adding drain diffusion capacitance of a dummy output MOSFET corresponding to the output circuit from which the read signal is output to input capacitance of an input circuit equivalent to the input circuit to which the write signal is input.

3. The semiconductor memory device according to claim 2,
wherein the output circuit from which said read signal is output includes a plurality of MOSFETs connected in parallel corresponding to required current supply capability, and
wherein the dummy output MOSFET added to said second input circuit also includes MOSFETs which are connected in parallel and are equivalent to those of said output circuit.

4. The semiconductor memory device according to claim 1,
wherein said command is input in response to a first clock,
wherein a signal input to or output from said data terminal is input or output in response to a second clock having a phase different from that of said first clock,
wherein an output signal of said second input circuit is latched by a latch circuit synchronized with said second clock, and the output signal and an output of said first input circuit are selectively transmitted to a first node, and
wherein a signal of said first node is latched by a latch circuit synchronized with said first clock and used as an internal mask signal for checking said writing.

5. The semiconductor memory device according to claim 1,
wherein said memory cell is a dynamic memory cell including a storage capacitor and an address selection MOSFET, and
wherein, by said bonding option technique, said first input circuit is set as a circuit for inputting a mask signal to form an SDRAM, or a second input circuit is set as a circuit for inputting a mask signal to form a DDR-SDRAM.

6. A semiconductor memory device comprising:
a plurality of memory cells, in which an access to any of said memory cells is designated according to a command;
a data terminal being used as an input terminal to which a write signal to said memory cell is input or being used as an output terminal from which a read signal from said memory cell is output;
an input circuit having addition capacitance corresponding to a difference between first input capacitance corresponding to the input terminal to which a signal relating to said command is input and second input capacitance corresponding to said data terminal, wherein a mask signal for checking writing of the write signal input from said data terminal into said memory cell is input by said input circuit and, by a metal option technique, said addition capacitance is not connected to the input circuit in a configuration of inputting said mask signal in response to said command, or said addition capacitance can be connected to said input circuit in a configuration of inputting said mask signal in response to the write signal.

7. The semiconductor memory device according to claim 6, wherein in the configuration of inputting said mask signal in response to said command, said addition capacitance is connected between source terminals in place of said input circuit by said metal option technique.

8. The semiconductor memory device according to claim 6, wherein as said addition capacitance, drain diffusion capacitance of a dummy output MOSFET corresponding to the output circuit from which the read signal is output is added.

9. The semiconductor memory device according to claim 8, wherein the output circuit from which said read signal is output includes a plurality of MOSFETs connected in parallel corresponding to required current supply capability, and wherein the dummy output MOSFET added to said second input circuit also includes MOSFETs which are connected in parallel and are equivalent to those of said output circuit.

10. The semiconductor memory device according to claim 6, wherein said command is input synchronously with a first clock, wherein a signal input or output to/from said data terminal is input or output synchronously with a second clock having a phase different from that of said first clock, wherein either a signal latched by a latch circuit synchronized with said second clock or an output passed through the latch is selectively transmitted as an output signal of said input circuit to a first node, and wherein a signal of said first node is latched by a latch circuit synchronized with said first clock and used as an internal mask signal for checking said writing.

11. The semiconductor memory device according to claim 6, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

12. A semiconductor memory device comprising:
a plurality of memory cells;
a first terminal to which a command signal is input;
a second terminal to which data is input or from which data is output; and
a third terminal to which a mask signal for inhibiting writing of data into said plurality of memory cells is input,
wherein capacitance connected to said first terminal is set as first capacitance, wherein capacitance connected to said second terminal is set as second capacitance different from said first capacitance, and wherein the device includes a circuit connected to said third terminal, capable of selecting either said first or second capacitance as capacitance to be connected to said third terminal.

13. The semiconductor memory device according to claim 12, further comprising a fourth terminal, wherein said circuit selects either said first or second capacitance as capacitance connected to said third terminal in accordance with a voltage applied to said fourth terminal.

14. The semiconductor memory device according to claim 13, wherein a predetermined voltage is applied to said fourth terminal by a bonding option technique.

15. The semiconductor memory device according to claim 12, wherein said semiconductor memory device is an SDR synchronous DRAM, and wherein said circuit selects said first capacitance as capacitance connected to said third terminal.

16. The semiconductor memory device according to claim 12, wherein said semiconductor memory device is a DDR synchronous DRAM, and wherein said circuit selects said second capacitance as capacitance connected to said third terminal.

17. The semiconductor memory device according to claim 12, wherein said semiconductor memory device is a double data rate synchronous memory, and wherein said circuit selects said second capacitance as capacitance connected to said third terminal.

18. The semiconductor memory device according to claim 12, wherein said circuit includes a first capacitor as said first capacitance, a second capacitor as said second capacitance, and a selection circuit for connecting either said first or second capacitor to said third terminal.

19. The semiconductor memory device according to claim 18, wherein said selection circuit includes a first switch 20. The semiconductor memory device according to claim 18, wherein said selection circuit connects said first or second capacitor to said third terminal by a metal option technique determined according to a state of a predetermined wiring layer.

21. A semiconductor memory device comprising:
a plurality of memory cells;
a first terminal to which a signal relating to command is input, input capacitance connected to said first terminal being set as first capacitance;
a second terminal to/from which data is input/output, input/output capacitance connected to said second terminal being set as second capacitance different from said first capacitance;
a third terminal;
a fourth terminal;
a first capacitor as input capacitance of said first capacitance connected to said third terminal;
a second capacitor as input capacitance of said second capacitance connected to said fourth terminal; and
a selection circuit for selectively making either a signal path from said third terminal or a signal path from said fourth terminal valid, and wherein an input mask signal for writing of data to said
a selection circuit for selectively making either a signal path from said third terminal or a signal path from said fourth terminal valid, and
wherein an input mask signal for writing of data to said plurality of memory cells is input to said third terminal or said fourth terminal.

22. The semiconductor memory device according to claim 21, further comprising a fifth terminal,
wherein said selection circuit selectively makes either the signal path from said third terminal or the signal path from said fourth terminal valid in accordance with a voltage applied to said fifth terminal.

23. The semiconductor memory device according to claim 22,
wherein a predetermined voltage is applied to said fifth terminal by a bonding option technique.

24. The semiconductor memory device according to claim 21,
wherein said semiconductor memory device is an SDR synchronous DRAM, and
said selection circuit makes the signal path from said third terminal valid.

25. The semiconductor memory device according to claim 21,
wherein said semiconductor memory device is a DDR synchronous DRAM, and
wherein said selection circuit makes the signal path from said fourth terminal valid.

26. The semiconductor memory device according to claim 21,
wherein said semiconductor memory device is a double data rate synchronous memory, and
wherein said selection circuit makes the signal path from said fourth terminal valid.

27. A semiconductor memory device comprising:
a plurality of memory cells;
a first terminal to which an address signal is input;
a second terminal to which data is input; and
a third terminal to which an input mask signal for said plurality of memory cells is input,
wherein capacitance connected to said first terminal is set as first capacitance,
wherein capacitance connected to said second terminal is set as second capacitance different from said first capacitance, and
wherein said device includes a circuit connected to said third terminal and capable of selecting either said first or second capacitance as capacitance connected to said third terminal.

28. A semiconductor memory device comprising:
a plurality of memory cells;
a first terminal to which an address signal is input, input capacitance connected to said first terminal being first value;
a second terminal to/from which data is input or output, input/output capacitance connected to said second terminal being second value different from said first value;
a third terminal;
a fourth terminal;
a first capacitor of said first value connected to said third terminal;
a second capacitor of said second value connected to said fourth terminal; and
a selection circuit for selectively making either a signal path from said third terminal or a signal path from said fourth terminal valid.

29. A single data rate semiconductor memory device comprising:
a plurality of memory cells;
a first terminal to which an address signal is input, capacitance connected to said first terminal being set as first capacitance;
a second terminal to which data is input, capacitance connected to said second terminal being set as second capacitance different from said first capacitance;
a third terminal to which an input mask signal for said plurality of memory cells is input; and
a circuit connected to said third terminal and capable of selecting either said first or second capacitance as capacitance connected to said third terminal,
wherein said circuit selects said first capacitance as capacitance connected to said third terminal.

30. A double data rate semiconductor memory device comprising:
a plurality of memory cells;
a first terminal to which an address signal is input, capacitance connected to said first terminal being set as first capacitance;
a second terminal to which data is input, capacitance connected to said second terminal being set as second capacitance different from said first capacitance;
a third terminal to which an input mask signal for checking writing of data into said plurality of memory cells is input; and
a circuit connected to said third terminal and capable of selecting either said first or second capacitance as capacitance connected to said third terminal,
wherein said circuit selects said second capacitance as capacitance connected to said third terminal.

31. A single data rate semiconductor memory device comprising:
a plurality of memory cells;
a first terminal to which an address signal is input;
a second terminal to/from which data is input or output;
a third terminal; and
a fourth terminal,
wherein input capacitance connected to said first terminal is set as first value,
wherein input/output capacitance connected to said second terminal is set as second value different from said first value,
said device includes:
a first capacitor of said first value connected to said third terminal;
a second capacitor of said second value connected to said fourth terminal; and
a selection circuit capable of selectively making either a signal path from said third terminal or a signal path from said fourth terminal valid,
wherein an input mask signal for writing of data into said plurality of memory cells is input to said third terminal, and
wherein said selection circuit makes the signal path from said third terminal valid.

32. A double data rate semiconductor memory device comprising:
a plurality of memory cells;
a first terminal to which an address signal is input;
a second terminal to/from which data is input or output;
a third terminal; and
a fourth terminal, wherein input capacitance connected to said first terminal is set as first value, wherein input/output capacitance connected to said second terminal is set as second value different from said first value, said device includes:

a first capacitor of said first value connected to said third terminal;

a second capacitor of said second value connected to said fourth terminal; and a selection circuit capable of selectively making either a signal path from said third terminal or a signal path from said fourth terminal valid, wherein an input mask signal for checking writing of data into said plurality of memory cells is input to said fourth terminal, and wherein said selection circuit makes the signal path from said fourth terminal valid.

33. The semiconductor memory device according to claim 7, wherein said command is input synchronously with a first clock, wherein a signal input or output to/from said data terminal is input or output synchronously with a second clock having a phase different from that of said first clock, wherein either a signal latched by a latch circuit synchronized with said second clock or an output passed through the latch is selectively transmitted as an output signal of said input circuit to a first node, and wherein a signal of said first node is latched by a latch circuit synchronized with said first clock and used as an internal mask signal for checking said writing.

34. The semiconductor memory device according to claim 33, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

35. The semiconductor memory device according to claim 7, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

36. The semiconductor memory device according to claim 8, wherein said command is input synchronously with a first clock, wherein a signal input or output to/from said data terminal is input or output synchronously with a second clock having a phase different from that of said first clock, wherein either a signal latched by a latch circuit synchronized with said second clock or an output passed through the latch is selectively transmitted as an output signal of said input circuit to a first node, and wherein a signal of said first node is latched by a latch circuit synchronized with said first clock and used as an internal mask signal for checking said writing.

37. The semiconductor memory device according to claim 36, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

38. The semiconductor memory device according to claim 8, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

39. The semiconductor memory device according to claim 9, wherein said command is input synchronously with a first clock, wherein a signal input or output to/from said data terminal is input or output synchronously with a second clock having a phase different from that of said first clock, wherein either a signal latched by a latch circuit synchronized with said second clock or an output passed through the latch is selectively transmitted as an output signal of said input circuit to a first node, and wherein a signal of said first node is latched by a latch circuit synchronized with said first clock and used as an internal mask signal for checking said writing.

40. The semiconductor memory device according to claim 39, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

41. The semiconductor memory device according to claim 9, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

42. The semiconductor memory device according to claim 10, wherein said memory cell is a dynamic memory cell including a storage capacitor and an address selection MOSFET, and wherein, by said metal option technique, an SDRAM is formed by a setting that addition capacitance is not connected to said input circuit or a DDR-SDRAM is formed by a setting that the addition capacitance is connected to said input circuit.

* * * * *